(12) United States Patent
Luo

(10) Patent No.: US 12,527,087 B2
(45) Date of Patent: Jan. 13, 2026

(54) DISPLAY DEVICE AND MANUFACTURING METHOD THEREOF

(71) Applicant: TCL CHINA STAR OPTOELECTRONICS TECHNOLOGY CO., LTD., Guangdong (CN)

(72) Inventor: Chuanbao Luo, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 1022 days.

(21) Appl. No.: 17/597,941

(22) PCT Filed: Jan. 10, 2022

(86) PCT No.: PCT/CN2022/070933
§ 371 (c)(1),
(2) Date: Jul. 6, 2023

(87) PCT Pub. No.: WO2023/123545
PCT Pub. Date: Jul. 6, 2023

(65) Prior Publication Data
US 2024/0038783 A1    Feb. 1, 2024

(30) Foreign Application Priority Data
Dec. 28, 2021   (CN) .......................... 202111622340.4

(51) Int. Cl.
*H01L 27/12*   (2006.01)
*H10D 86/01*   (2025.01)
(Continued)

(52) U.S. Cl.
CPC ......... *H10D 86/60* (2025.01); *H10D 86/0231* (2025.01); *H10D 86/471* (2025.01)

(58) Field of Classification Search
CPC .... H10D 86/60; H10D 86/0231; H10D 86/01; H10D 86/471; H10D 86/40;
(Continued)

(56) References Cited

U.S. PATENT DOCUMENTS

| 7,825,406 B2 * | 11/2010 | Yoshida | ................. H10D 86/40 257/40 |
| 2009/0321725 A1 * | 12/2009 | Yoshida | ................. H10D 86/40 257/E21.414 |
| 2016/0133754 A1 | 5/2016 | Moon et al. | |

FOREIGN PATENT DOCUMENTS

| CN | 101958339 A | 1/2011 |
| CN | 103794633 A | 5/2014 |

(Continued)

OTHER PUBLICATIONS

Chinese Office Action issued in corresponding Chinese Patent Application No. 202111622340.4 dated Aug. 24, 2024, pp. 1-7.
(Continued)

*Primary Examiner* — Nikolay K Yushin
(74) *Attorney, Agent, or Firm* — PV IP PC; Christopher S. Ruprecht; Wei Te Chung

(57) ABSTRACT

A display device and a manufacturing method thereof are provided. The display device includes a substrate, a switching thin film transistor, and a driving thin film transistor. The switching thin film transistor includes a first gate, a first active layer, a first source, and a first drain disposed on the substrate, wherein the first source and the first drain are disposed on a side of the first active layer away from the substrate. The driving thin film transistor includes a second source, a second drain, a second active layer, and a second gate disposed on the substrate, wherein the second active layer is positioned on a side of the second source and the second drain away from the substrate.

19 Claims, 4 Drawing Sheets

(51) Int. Cl.
*H10D 86/40* (2025.01)
*H10D 86/60* (2025.01)

(58) Field of Classification Search
CPC .. H10D 86/423; H10D 30/6755; H10D 30/67; H10D 30/6723
See application file for complete search history.

(56) References Cited

FOREIGN PATENT DOCUMENTS

| | | | |
|---|---|---|---|
| CN | 206618932 | U | 11/2017 |
| CN | 107516661 | A | 12/2017 |
| CN | 109742153 | A | 5/2019 |
| CN | 110534531 | A | 12/2019 |
| CN | 112002763 | A | 11/2020 |
| CN | 113629072 | A | 11/2021 |
| JP | 6806956 | B1 | 1/2021 |

OTHER PUBLICATIONS

International Search Report in International application No. PCT/CN2022/070933, mailed on Aug. 30, 2022.
Written Opinion of the International Search Authority in International application No. PCT/CN2022/070933, mailed on Aug. 30, 2022.

* cited by examiner

DISPLAY DEVICE AND MANUFACTURING METHOD THEREOF

FIELD OF INVENTION

The present application relates to a field of display technology and particularly relates to a display device and a manufacturing method of the display device.

BACKGROUND OF INVENTION

Currently, for large-size current-mode display devices such as organic light-emitting diode (OLED) display devices, mini light-emitting diode (Mini LED) display devices, or micro light-emitting diode (Micro LED) display devices, switching thin-film transistors (TFTs) and driving TFTs in their pixel circuits are all TFT devices of a same structure type, for example, they are both bottom-gate TFTs or top-gate TFTs.

Technical Problem

Bottom-gate thin-film transistors (TFTs) and top-gate TFTs have their own advantages. Specifically, in terms of reducing a size of a TFT to enhance resolution of a display panel, sizes of the bottom-gate TFTs are smaller than that of the top-gate TFTs, and in terms of device stability required for current driving, stability of the top-gate TFTs is better than that of the bottom-gate TFTs. For their pixel circuits, the stability requirements of a switching TFT and a driving TFT are different. For example, the switching TFT is responsible for writing voltage, so stability of the switching TFT is not required to be high, and the driving TFT is responsible for driving light-emitting diode (LED) to emit light, so the driving TFT is required to have high stability. That is, the switching TFT and the driving TFT of a same structure type TFT device cannot satisfy requirements for both resolution and stability of the TFT device. Therefore, how to improve the stability of the TFT device while enhancing the resolution of the display panel has become a technical problem to be solved urgently.

SUMMARY OF INVENTION

Embodiments of the present application provide a display device and a manufacturing method of the display device, which can improve the stability of the TFT device while enhancing the resolution of the display panel.

An embodiment of the present application provides a display device, which includes: a substrate; a switching thin film transistor disposed on a side of the substrate and including a first gate, a first active layer, a first source, and a first drain, wherein the first gate is disposed on the substrate, the first active layer is positioned on a side of the first gate away from the substrate, and the first source and the first drain are disposed in a same layer on a side of the first active layer away from the substrate; and a driving thin film transistor disposed on a side of the substrate and connected to the switching thin film transistor, wherein the driving thin film transistor includes a second source, a second drain, a second active layer, and a second gate, and wherein the second source and the second drain are disposed in a same layer of the substrate, the second active layer is positioned on a side of the second source and the second drain away from the substrate, and the second gate is positioned on a side of the second active layer away from the substrate.

Optionally, in some embodiments of the present application, the first gate, the second source, and the second drain are disposed in a same layer.

Optionally, in some embodiments of the present application, the second active layer includes a channel, and wherein an orthographic projection of the second source or an orthographic projection of the second drain on a plane where the channel is located at least partially covers the channel.

Optionally, in some embodiments of the present application, the second active layer further includes a source contact part and a drain contact part positioned at opposite sides of the channel, wherein the second source is connected to the source contact part and extends from the source contact part toward the drain contact part, and wherein an orthographic projection of the channel on a plane where the substrate is located is positioned within an orthographic projection of the second source on the plane where the substrate is located, and the second drain is connected to the drain contact part.

Optionally, in some embodiments of the present application, the display device further includes a gate insulating layer disposed between the channel and the second gate, wherein in a direction of the second source toward the second drain, a width of the second gate is less than a width of the gate insulating layer.

Optionally, in some embodiments of the present application, the first source, the first drain, and the second gate are positioned in a same metal layer.

Optionally, in some embodiments of the present application, the display device further includes a connecting electrode positioned on a side of the second gate away from the substrate, wherein the second gate is connected to the first drain through the connecting electrode.

Optionally, in some embodiments of the present application, the first active layer and the second active layer are disposed in a same layer, and material of the first active layer and material of the second active layer both include a metal oxide semiconductor.

Optionally, in some embodiments of the present application, an orthographic projection of the second source on a plane where the substrate is located is positioned outside an orthographic projection of the channel on the plane where the substrate is located, and wherein the display device further includes a light shielding layer disposed on a side of the substrate close to the second active layer, and an orthographic projection of the light shielding layer on the plane where the substrate is located covers the channel.

An embodiment of the present application further provides a display device, which includes: a substrate; a switching thin film transistor disposed on a side of the substrate and including a first gate, a first active layer, a first source, and a first drain, wherein the first gate is disposed on the substrate, the first active layer is positioned on a side of the first gate away from the substrate, and the first source and the first drain are disposed in a same layer on a side of the first active layer away from the substrate; and a driving thin film transistor disposed on a side of the substrate and connected to the switching thin film transistor, wherein the driving thin film transistor includes a second source, a second drain, a second active layer, and a second gate, and wherein the second source and the second drain are disposed in a same layer of the substrate, the second active layer is positioned on a side of the second source and the second drain away from the substrate, and the second gate is positioned on a side of the second active layer away from the substrate; and wherein the first source, the first drain, and the second gate are positioned in a same metal layer, and the first gate, the second source, and the second drain are disposed in a same layer.

Optionally, in some embodiments of the present application, the second active layer includes a channel, and wherein an orthographic projection of the second source or an orthographic projection of the second drain on a plane where the channel is located at least partially covers the channel.

Optionally, in some embodiments of the present application, the second active layer further includes a source contact part and a drain contact part positioned at opposite sides of the channel, wherein the second source is connected to the source contact part and extends from the source contact part toward the drain contact part, and wherein an orthographic projection of the channel on a plane where the substrate is located is positioned within an orthographic projection of the second source on the plane where the substrate is located, and the second drain is connected to the drain contact part.

Optionally, in some embodiments of the present application, the display device further includes a gate insulating layer disposed between the channel and the second gate, wherein in a direction of the second source toward the second drain, a width of the second gate is less than a width of the gate insulating layer.

Optionally, in some embodiments of the present application, the display device further includes a connecting electrode positioned on a side of the second gate away from the substrate, wherein the second gate is connected to the first drain through the connecting electrode.

Optionally, in some embodiments of the present application, the first active layer and the second active layer are disposed in a same layer, and the material of the first active layer and material of the second active layer both include a metal oxide semiconductor.

Optionally, in some embodiments of the present application, an orthographic projection of the second source on a plane where the substrate is located is positioned outside an orthographic projection of the channel on the plane where the substrate is located, and wherein the display device further includes a light shielding layer disposed on a side of the substrate close to the second active layer, and an orthographic projection of the light shielding layer on the plane where the substrate is located covers the channel.

An embodiment of the present application further provides a manufacturing method of the display device as described in the foregoing embodiment, which includes following steps: providing the substrate; forming a first metal layer on the substrate; patterning the first metal layer to form the first gate, the second source, and the second drain; forming the first active layer on the first gate, and forming the second active layer on the second source and the second drain; forming the first source and the first drain on the first active layer, and forming the second gate on the second active layer.

Optionally, in some embodiments of the present application, after the step of forming the second active layer on the second source and the second drain further includes: forming a gate insulating layer on the second active layer, wherein an orthographic projection of the gate insulating layer on a plane where the substrate is located at least partially overlaps with an orthographic projection of the second source on the plane where the substrate is located.

Optionally, in some embodiments of the present application, wherein the step of forming the first source and the first drain on the first active layer, and forming the second gate on the second active layer further includes: forming a second metal layer on the gate insulating layer, wherein the second metal layer covers the first active layer and part of the second active layer not covered by the gate insulating layer; and patterning the second metal layer to form the first source, the first drain, and the second gate.

Optionally, in some embodiments of the present application, in the step of forming the second metal layer on the gate insulating layer, a region of the second active layer covered by the gate insulating layer is formed into a channel, a source contact part and a drain contact part is formed at a portion of the second active layer not covered by the gate insulating layer, the source contact part contacts with the second source, and the drain contact part contacts with the second drain.

Beneficial Effect

In the display device provided by the present application, the first gate of the switching thin film transistor is positioned below the first active layer, that is, the switching thin film transistor is a bottom-gate type thin film transistor. Further, the second gate of the driving thin film transistor is positioned above the second active layer, the second source and the second drain are positioned under the second active layer, that is, the driving thin film transistor is a novel top-gate type thin film transistor. Therefore, in the present application, the switching thin film transistor is configured to be a bottom-gate type structure while the driving thin film transistor is configured to be a novel top-gate type structure, which can improve the stability of the TFT device while enhancing the resolution of the display panel to meet the design requirements of high-resolution and high-stability display products.

DESCRIPTION OF DRAWINGS

In order to illustrate the technical solutions in the embodiments of the present application more clearly, the following briefly introduces the drawings that need to be used in the description of the embodiments. Obviously, the drawings in the description are only some embodiments of the present application, and for those skilled in the art, other drawings can also be obtained from these drawings without creative effort.

DETAILED DESCRIPTION OF PREFERRED EMBODIMENTS

Figure 1:
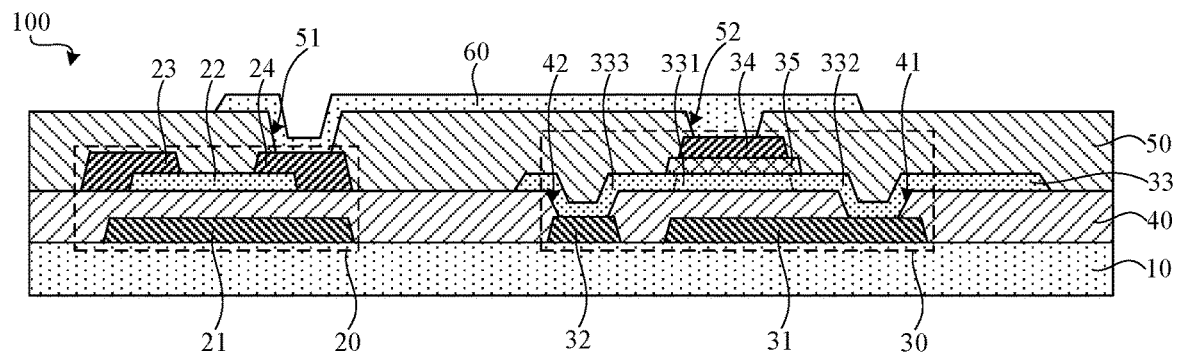
FIG. 1 is a schematic structural diagram of a display device provided in a first embodiment of the present application.

The following will describe the technical solutions in the embodiments of the present application clearly and completely with reference to the drawings in the embodiments of the present application. Obviously, the embodiments are only part of the embodiments of the present application, rather than all the embodiments. Based on these embodiments in this application, all other embodiments obtained by those skilled in the art without doing creative work shall fall within the protection scope of this application.

In the present application, it should be noted that the orientation or positional relationship indicated by the terms "above", "below", "front", "back", "left", "right", "inner", and "outer", etc. refer to the orientation or positional relationship shown in the drawings. It is only for the convenience of describing this application and simplifying the description, rather than indicating or implying that the device or element referred to must have a specific orientation, be constructed, or operated in a specific orientation, and therefore it cannot be understood as a limitation of the present application. In addition, the terms "first" and "second" are only used for descriptive purposes, and they cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise expressly and specifically defined.

The present application provides a display device and a manufacturing method of the display device. Each of them will be described in detail below. It should be noted that the description order of the following embodiments is not intended to limit the preferred order of the embodiments.

The present application provides a display device including a substrate, a switching thin film transistor, and a driving thin film transistor. The switching thin film transistor is disposed on a side of the substrate and includes a first gate, a first active layer, a first source, and a first drain, wherein the first gate is disposed on the substrate, the first active layer is positioned on a side of the first gate away from the substrate, and the first source and the first drain are disposed in a same layer on a side of the first active layer away from the substrate. The driving thin film transistor is disposed on a side of the substrate and is connected to the switching thin film transistor, wherein the driving thin film transistor includes a second source, a second drain, a second active layer, and a second gate, and wherein the second source and the second drain are disposed in a same layer of the substrate, the second active layer is positioned on a side of the second source and the second drain away from the substrate, and the second gate is positioned on a side of the second active layer away from the substrate.

In the display device provided by the present application, because the first gate of the switching thin film transistor is positioned below the first active layer, that is, the switching thin film transistor has a bottom-gate structure. Further, the second gate of the driving thin film transistor is positioned above the second active layer, and the second source and the second drain are positioned under the second active layer, that is, the driving thin film transistor has a new type of top-gate structure. Therefore, in the present application, the switching thin film transistor is configured to be a bottom-gate type structure while the driving thin film transistor is configured to be a novel top-gate type structure, which can improve the stability of the TFT device while enhancing the resolution of the display panel to meet the design requirements of high-resolution and high-stability display products.

The display device provided by the present application will be described in detail with the following specific embodiments.

Please refer to FIG. 1. A first embodiment of the present application provides a display device 100. The display device 100 includes a substrate 10, a switching thin film transistor 20, and a driving thin film transistor 30.

In this embodiment, the substrate 10 may be a rigid substrate, such as a glass substrate. In some embodiments, the substrate 10 may also be a flexible substrate, such as a polyimide substrate.

The switching thin film transistor 20 is disposed on a side of the substrate 10. The switching thin film transistor 20 has a bottom-gate structure. The switching thin film transistor 20 includes a first gate 21, a first active layer 22, a first source 23, and a first drain 24.

The first gate 21 is disposed on the substrate 10. Wherein, the first gate 21 may be a single-layer structure, a double-layer structure, or a multi-layer structure. The material of the first gate 21 may include one or more of copper, aluminum, molybdenum, or titanium. For example, when the first gate 21 has a double-layer structure, the double-layer structure may include a bottom layer with molybdenum as a conductive material and a top layer with copper as a conductive material.

The first active layer 22 is positioned on a side of the first gate 21 away from the substrate 10. The material of the first active layer 22 includes metal oxide semiconductors, such as one or more of indium gallium zinc oxide (IGZO), indium gallium tin oxide (IGTO), indium zinc tin oxide (IZTO), indium gallium zinc tin oxide (IGZTO), indium tin oxide (ITO), or indium zinc oxide (IZO). In this embodiment, the orthographic projection of the first active layer 22 on a plane where the substrate 10 is located is positioned within the orthographic projection of the first gate 21 on the plane where the substrate 10 is located. This arrangement enables the first gate 21 to shield the light from under the substrate to prevent the first active layer from being affected by the light to reduce the performance of the switching TFT.

In this embodiment, the display device 100 further includes a buffer layer 40 disposed between the first gate 21 and the first active layer 22. The buffer layer 40 may be a single-layer structure, a double-layer structure, or a multi-layer structure. The material of the buffer layer 40 may include one or more of silicon oxide, silicon nitride, or silicon oxynitride. For example, when the buffer layer 40 has a double-layer structure, the double-layer structure may include a bottom layer with silicon oxide as an insulating material and a top layer with silicon nitride as an insulating material.

The first source 23 and the first drain 24 are disposed in the same layer on the side of the first active layer 22 away from the substrate 10. The first source 23 and the first drain 24 may have a single-layer structure, a double-layer structure, or a multi-layer structure. The material of the first source 23 and the material of the first drain 24 are the same, and they may include one or more of copper, aluminum, molybdenum, or titanium. For example, when the first source 23 and the first drain 24 have a double-layer structure, the double-layer structure may include a bottom layer with molybdenum as a conductive material and a top layer with copper as a conductive material.

In this embodiment, the orthographic projection of the first gate 21 on the plane where the substrate 10 is located overlaps with the orthographic projection of the first source 23 and the orthographic projection of the first drain 24 on the plane where the substrate 10 is located, respectively. This arrangement enables a gate electric field to be formed between the first gate 21 and the first source 23 and the first drain 24 respectively, to realize the control of electron movement in the regions where the first source 23 and the first drain 24 are located.

The driving thin film transistor 30 is disposed on a side of the substrate 10. The driving thin film transistor 30 has a top-gate structure. The driving thin film transistor 30 is connected to the switching thin film transistor 20. The driving thin film transistor 30 includes a second source 31, a second drain 32, a second active layer 33, and a second gate 34.

The second source 31 and the second drain 32 are disposed on the substrate 10 in the same layer. The second source 31 and the second drain 32 may have a single-layer structure, a double-layer structure, or a multi-layer structure. The material of the second source 31 and the material of the second drain 32 are the same, and they may include one or more of copper, aluminum, molybdenum, or titanium. For example, when the second source 31 and the second drain 32 have a double-layer structure, the double-layer structure may include a bottom layer with molybdenum as a conductive material and a top layer with copper as a conductive material.

The second active layer 33 is positioned on a side of the second source 31 and the second drain 32 away from the substrate 10. The material of the second active layer 33 includes metal oxide semiconductors, such as one or more of IGZO, IGTO, IZTO, IGZTO, ITO, or IZO. In this embodiment, the second active layer 33 and the first active layer 22 are disposed in the same layer, and the materials of the two are the same. This arrangement can improve the film uniformity of the first active layer 22 and the second active layer 33 to meet the requirements of large-size display products.

Specifically, the second active layer 33 includes a channel 331 and a source contact part 332 and a drain contact part 333 located on opposite sides of channel 331. The second source 31 is connected to the source contact part 332 through the first via hole 41 in the buffer layer 40. The second drain 32 is connected to the drain contact part 333 through a second via hole 42 in the buffer layer 40. In this embodiment, the material of the source contact part 332 and the material of the drain contact part 333 are both conductors.

The orthographic projection of the second source 31 or the second drain 32 on the plane where channel 331 is located at least partially covers the channel 331. In this embodiment, the orthographic projection of the second source 31 on the plane where the channel 331 is located at least partially covers the channel 331. The channel 331 and the second gate 34 are disposed opposite to each other so when the second source 31 and the channel 331 have an overlapping area, the second source 31 and the second gate 34 also have an overlapping area. The second source 31 is usually at a low potential such as zero potential, and the second gate electrode 34 is usually at a positive or negative potential. This arrangement enables the electric field formed between the second source 31 and the second gate 34 to be shielded to the gate insulating layer 35, which prevents from affecting the driving performance of the driving thin film transistor 30.

Specifically, the second source 31 extends from the source contact part 332 toward the drain contact part 333. The orthographic projection of channel 331 on the plane where substrate 10 is located is positioned in the orthographic projection of the second source 31 on the plane where the substrate 10 is located. The arrangement enables the second source 31 to shield the ambient light from below the substrate 10, which prevents the influence of light on the channel 331. Therefore, the photo-generated leakage current of the driving thin film transistor 30 can be reduced to further improve the stability of the driving thin film transistor 30.

Therefore, in this embodiment, the second source 31 and the second drain 32 of the driving thin film transistor 30 are disposed under the second active layer 33 and the second source 31 covers the area where the channel 331 is located, so that while improving the stability of the driving thin film transistor 30, the second source 31 can be used to avoid the influence of ambient light on the channel 331. This can further omit the arrangement of the light shielding layer in the conventional structure, thereby helping to save the manufacturing cost of the display device 100.

The second gate 34 is positioned on the side of the second active layer 33 away from the substrate 10. Wherein, the second gate 34 may be a single-layer structure, a double-layer structure, or a multi-layer structure. The material of the second gate 34 may include one or more of copper, aluminum, molybdenum, or titanium. For example, when the second gate 34 has a double-layer structure, the double-layer structure may include a bottom layer with molybdenum as a conductive material and a top layer with copper as a conductive material.

Agate insulating layer 35 is disposed between the channel 331 and the second gate 34. From a direction of the second source 31 toward the second drain 32, the width of the second gate 34 is less than the width of the gate insulating layer 35. The gate insulating layer 35 may have a single-layer structure, a double-layer structure, or a multi-layer structure. The material of the gate insulating layer 35 may include one or more of silicon oxide, silicon nitride, or silicon oxynitride. For example, when the gate insulating layer 35 has a double-layer structure, the double-layer structure may include a bottom layer with silicon oxide as an insulating material and a top layer with silicon nitride as an insulating material. It can be understood that during the conductorization process of the regions where the source contact part 332 and the drain contact part 333 are located, due to the influence of thermal diffusion, the actual width of the channel will be less than the width of the gate insulating layer. Therefore, in this embodiment, the width of the second gate 34 is configured to be less than the width of the gate insulating layer 35, the width of the second gate 34 and the width of the channel 331 of the driving thin film transistor 30 can be ensured.

As described above, in the display device 100 provided in this embodiment, the first gate 21 of the switching thin film transistor 20 is located below the first active layer 22, that is, the switching thin film transistor 20 has a bottom-gate structure. Further, the second gate 34 of the driving thin film transistor 30 is located above the second active layer 33, the second source 31 and the second drain 32 are located below the second active layer 33, that is, the driving thin film transistor 30 has a novel type of top-gate structure. Therefore, in the present application, while the switching thin film transistor 20 is configured to be a bottom-gate type structure, the driving thin film transistor 30 is configured to be a novel type of top-gate structure, which can improve the stability of the TFT device while enhancing the resolution of the display panel to meet the design requirements of high-resolution and high-stability display products.

In this embodiment, the first gate 21, the second source 31, and the second drain 32 are disposed in the same layer. That is, the first gate 21, the second source 31, and the second drain 32 are positioned in the same metal layer. In other words, the first gate 21, the second source 31, and the second drain 32 are formed by using the same mask.

Further, the first source 23, the first drain 24, and the second gate 34 are positioned in the same metal layer. That is, the first source 23, the first drain 24, and the second gate 34 are formed by using the same mask.

In this embodiment, the display device 100 further includes a passivation layer 50 and a connecting electrode 60. The passivation layer 50 covers the switching thin film transistor 20 and the driving thin film transistor 30. The connecting electrode 60 is positioned on the side of the passivation layer 50 away from the substrate 10, and is used to realize the electrical connection between the switching thin film transistor 20 and the driving thin film transistor 30.

Specifically, the passivation layer 50 is disposed on the side of the first source 23, the first drain 24, and the second gate 34 away from the substrate 10. A first connecting hole 51 and a second connecting hole 52 are defined in the passivation layer 50. The first connecting hole 51 exposes the first drain 24. The second connecting hole 52 exposes the second gate 34. The connecting electrode 60 covers the first connecting holes 51 and the second connecting holes 52. The second gate 34 is connected to the first drain 24 through the connecting electrode 60. Wherein, the passivation layer 50 may be a single-layer structure, a double-layer structure, or a multi-layer structure. The material of the passivation layer 50 may include one or more of silicon oxide, silicon nitride, or silicon oxynitride. For example, when the passivation layer 50 has a double-layer structure, the double-layer structure may include a bottom layer with silicon oxide as an insulating material and a top layer with silicon nitride as an insulating material. The material of the connecting electrode 60 may include ITO.

Therefore, in the display device 100 provided by this embodiment, the switching thin film transistor 20 is configured to be a bottom-gate type structure, and the driving thin film transistor 30 is configured to be a novel top-gate type structure. It can improve the stability of the TFT device while enhancing the resolution of the display panel to meet the requirements of high-resolution and high-stability display products. Further, because the first source 23 and the first drain 24 of the switching thin film transistor 20 and the second gate 34 of the driving thin film transistor 30 are positioned in the same metal layer, the first gate 21 of the switching thin film transistor and the second source 31 and the second drain 32 of the driving thin film transistor are positioned in the same metal layer, and because the second source 31 and the channel 331 of the driving thin film transistor 30 have an overlapping area, they can act as a light shielding layer in the traditional structure to avoid the influence of light on the channel 331. Because only two metal layers need to be provided in the display device 100 in this embodiment, the manufacturing process of the display device 100 is greatly simplified, and the manufacturing cost of the display device 100 can be reduced.

Figure 2A:
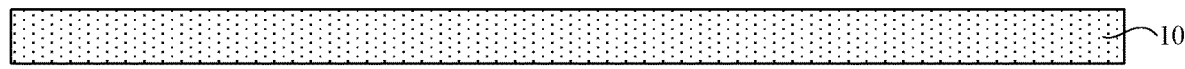
FIG. 2A to FIG. 2H are schematic flow charts of a manufacturing method of the display device provided by the first embodiment of the present application.

Please refer to FIG. 1 and FIG. 2A to FIG. 2H. The present application further provides a manufacturing method of a display device 100, which includes following steps:

B1: providing a substrate 10, as shown in FIG. 2A.

Figure 2B:
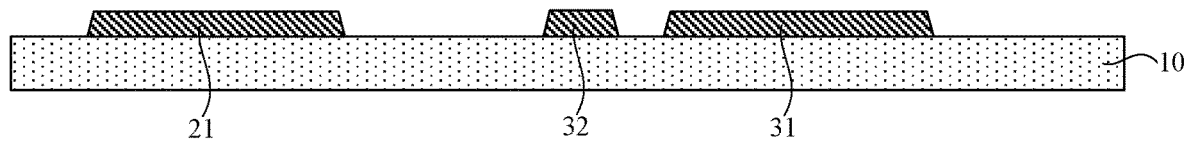

B2: forming a first gate 21, a second source 31, and a second drain 32 on substrate 10, as shown in FIG. 2B.

First, at least one of molybdenum, copper, or titanium is used as a material, a physical vapor deposition process is performed to form the first metal layer (not shown) on the substrate 10. Then, the first metal layer is patterned to form the first gate 21, the second source 31, and the second drain 32. Wherein, the patterning process includes exposure, development, etching, and other processes, and the related technologies are disclosed by the prior art, which will not be repeated herein.

Figure 2C:
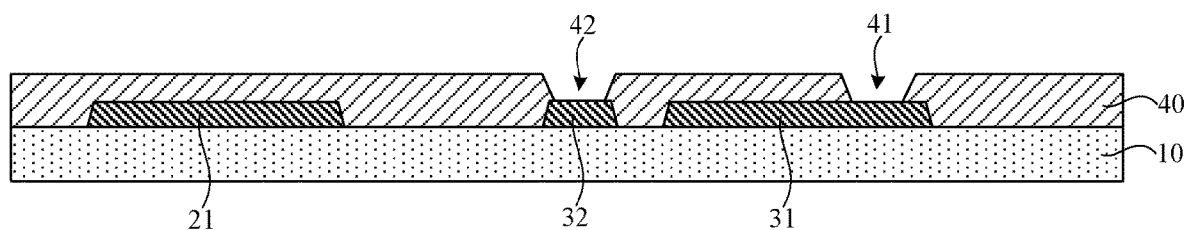

B3: forming a buffer layer 40 on the first gate 21, the second source 31, and the second drain 32, as shown in FIG. 2C.

First, at least one of silicon oxide or silicon nitride is used as a material, a chemical vapor deposition process is performed to form the buffer layer 40, and the buffer layer 40 is annealed at a temperature range from 300° C. to 400° C. for 2 to 3 hours. Then, the buffer layer 40 is patterned to form a first via hole 41 exposing the second source 31 and a second via hole 42 exposing the second drain 32.

Figure 2D:
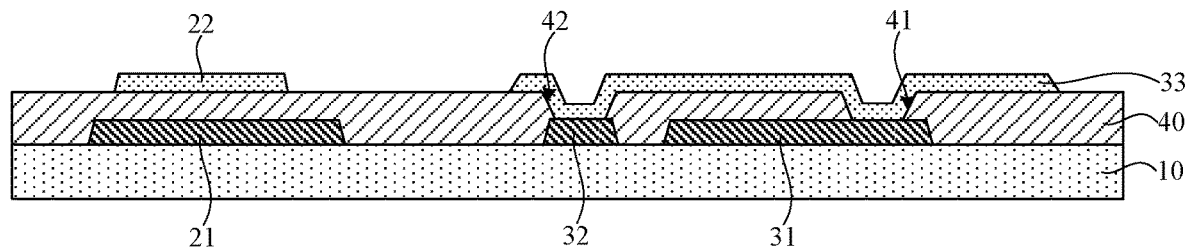

B4 forming a first active layer 22 and a second active layer 33 on the buffer layer 40, as shown in FIG. 2D.

First, at least one of IGZO, IGTO, IZTO, or IGZTO is used as a material, a deposition process is performed to form an active base layer (not shown). Then, the active base layer is patterned to form a first active layer 22 corresponding to the first gate 21 and a second active layer 33 corresponding to the second source 31 and the second drain 32.

Figure 2E:
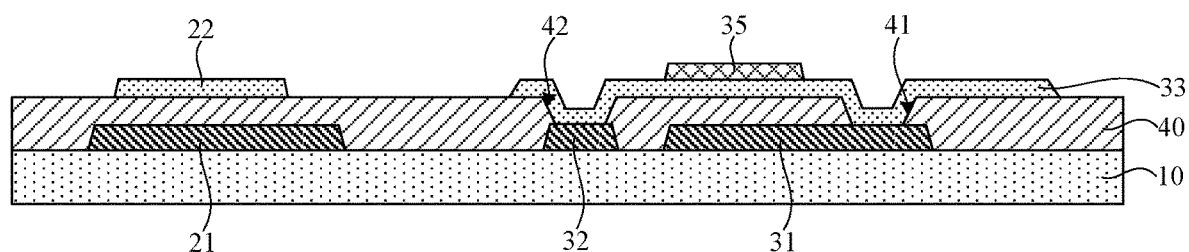

B5: The gate insulating layer 35 is formed on the second active layer 33, as shown in FIG. 2E.

Specifically, at least one of silicon oxide or silicon nitride is used as a material, a chemical vapor deposition process and a photolithography process are performed to form the gate insulating layer 35, and the gate insulating layer 35 is disposed above the second source 31. The orthographic projection of the gate insulating layer 35 on the plane where the substrate 10 is located at least partially overlaps with the orthographic projection of the second source 31 on the plane where the substrate 10 is located. Preferably, the orthographic projection of the gate insulating layer 35 on the plane where the substrate 10 is located is positioned within the orthographic projection of the second source 31 on the plane where the substrate 10 is located.

Figure 2F:
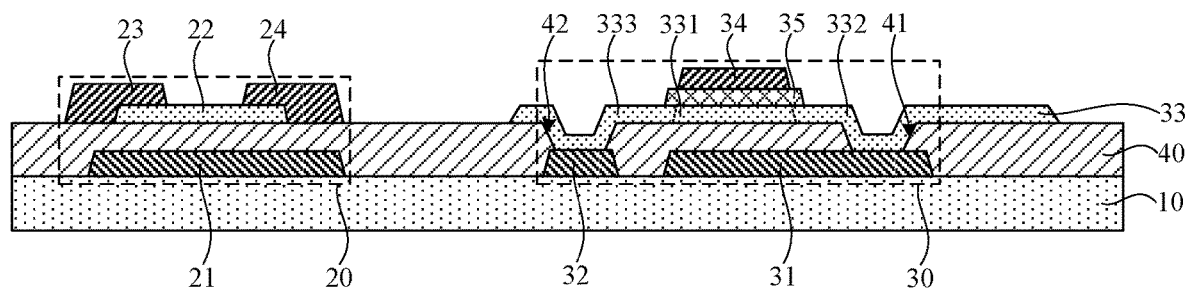

B6: forming a first source 23 and a first drain 24 on the first active layer 22, and forming a second gate 34 on the gate insulating layer 35, as shown in FIG. 2F.

First, at least one of molybdenum, copper, or titanium is used as a material, a second metal layer (not shown) is formed on the gate insulating layer 35 by a physical vapor deposition process, and the second metal layer covers portions of the first active layer 22 and the second active layer 33 that are not covered by the gate insulating layer 35. In a process of depositing the second metal layer, an area of the second active layer 33 covered by the gate insulating layer 35 is formed as a channel 331, and an area of the second active layer 33 not covered by the gate insulating layer 35 is conductorized. The orthographic projection of channel 331 on the plane where substrate 10 is located is positioned within the orthographic projection of the second source 31 on the plane where substrate 10 is located. The conductorized portion of the second active layer 33 includes a source contact part 332 in contact with the second source 31, and a drain contact part 333 in contact with the second drain 32. Then, the second metal layer is patterned to form the first source 23, the first drain 24, and the second gate 34.

In this embodiment, the first gate 21, the first active layer 22, the first source 23, and the first drain 24 constitute the switching thin film transistor 20, and the second source 31, the second drain 32, the second active layer 33, and the second gate 34 constitute the driving thin film transistor 30.

Figure 2G:
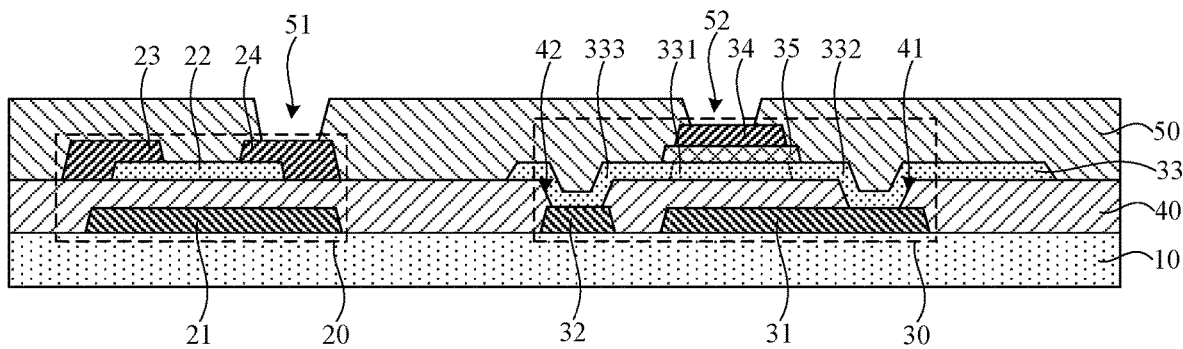

B7: forming a passivation layer 50 on the first source 23, the first drain 24, and the second gate 34. The passivation layer 50 includes a first connecting hole 51 and a second connecting hole 52, as shown in FIG. 2G.

Specifically, at least one of silicon oxide or silicon nitride is used as a material, and a chemical vapor deposition process is performed to form the passivation layer 50. Then, the passivation layer 50 is patterned to form a first connecting hole 51 exposing the first drain 24 and a second connecting hole 52 exposing the second gate 34.

Figure 2H:
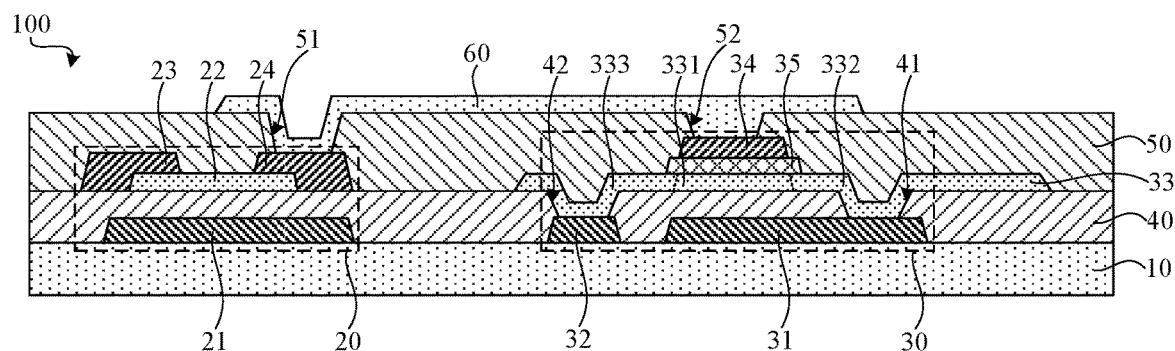

B8: forming a connecting electrode 60 on the passivation layer 50, as shown in FIG. 2H.

Specifically, ITO is used as a material, a physical vapor deposition process and a photolithography process are performed to form the connecting electrode 60, and the connecting electrode 60 covers the first connecting hole 51 and the second connecting hole 52. The second gate 34 is connected to the first drain 24 through the connecting electrode 60 to realize signal transmission between the switching thin film transistor 20 and the driving thin film transistor 30.

Thus, the manufacturing method of the display device 100 provided by the present application is completed.

Figure 3:
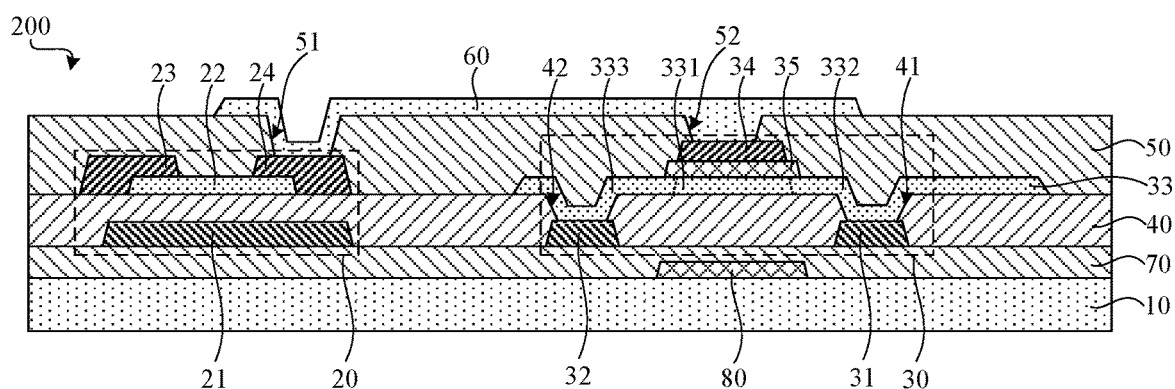
FIG. 3 is a schematic structural diagram of a display device provided by a second embodiment of the present application.

Please refer to FIG. 3, a display device 200 is provided in a second embodiment of the present application. The difference between the display device 200 provided in the second embodiment of the present application and the first embodiment is as follows:

An orthographic projection of the second source 31 on a plane where the substrate 10 is located is positioned outside an orthographic projection of the channel 331 on the plane where the substrate 10 is located. The light shielding layer 80 is disposed on the substrate 10, the inorganic insulating layer 70 is disposed on a side of the light shielding layer 80 close to the second source 31, and an orthographic projection of the light shielding layer 80 on a plane where the channel 331 is located covers the channel 331.

In this embodiment, the light shielding layer 80 is used for shielding the ambient light from under the substrate 10 to avoid the influence of the light on channel 331, thereby reducing the photo-generated leakage current of the driving thin film transistor 30 to further improve the stability of the driving thin film transistor 30.

Wherein, the material of the inorganic insulating layer 70 may include one or more of silicon oxide, silicon nitride, or silicon oxynitride. The material of the light shielding layer 80 may include one or more of copper, aluminum, molybdenum, or titanium. The material of the inorganic insulating layer 70 and the material of the light shielding layer 80 are not specifically limited in the present application.

In this application, the display device may be a current-driven display device such as an organic light-emitting diode (OLED) display device, a mini light-emitting diode (Mini LED) display device, or a micro light-emitting diode (Micro LED) display device. Wherein, the display device can be used for a backlight module in a liquid crystal display device or can be directly displayed.

Taking the display device as an OLED display device as an example, the OLED display device includes a pixel driving circuit. Wherein, the pixel driving circuit may be 2T1C pixel driving circuit, 3T1C pixel driving circuit, 3T2C pixel driving circuit, 4T1C pixel driving circuit, 4T2C pixel driving circuit, 5T1C pixel driving circuit, 5T2C pixel driving circuit, 6T1C pixel driving circuit, 6T2C pixel driving circuit, 7T1C pixel driver circuit, or 7T2C pixel driver circuit.

Figure 4:
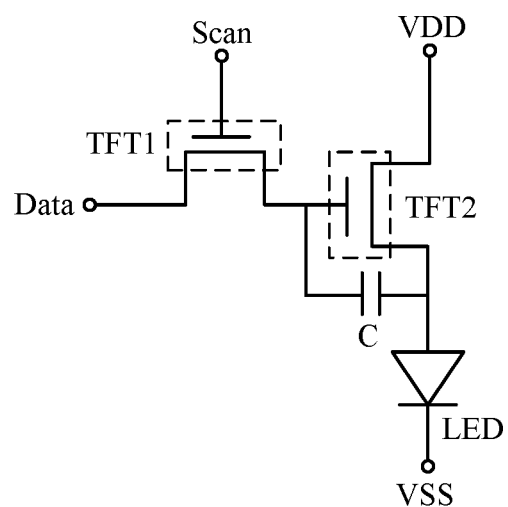
FIG. 4 is a schematic structural diagram of a pixel driving circuit of a display device provided by an example of the present application.

Please refer to FIG. 4. In a specific example, the pixel driving circuit is a 2T1C pixel driving circuit. Specifically, the 2T1C pixel driving circuit includes a first thin film transistor TFT1, a second thin film transistor TFT2, and a capacitor C. Wherein, the first thin film transistor TFT1 can be an N-type transistor used as a switching thin film transistor, the second thin film transistor TFT2 can be a P-type transistor used as a driving thin film transistor, and the capacitor C can be a storage capacitor.

Further, the gate of the first thin film transistor TFT1 is connected to the scan signal (Scan), the source is connected to the data signal (Data), and the drain is electrically connected to the gate of the second thin film transistor TFT2 and one end of the capacitor C. The source of the second thin film transistor TFT2 is electrically connected to the positive power supply voltage VDD, and the drain is electrically connected to the anode of the organic light-emitting diode LED. The cathode of the organic light-emitting diode LED is connected to the low voltage power supply VSS.

When the OLED is displayed, the scan signal (Scan) controls the conduction of the first thin film transistor TFT1, and the data signal (Data) is transmitted to the gate and the capacitor C of the second thin film transistor TFT2 through the first thin film transistor TFT1. Then the first thin film transistor TFT1 is turned off. Due to the storage function of the capacitor C, the gate voltage of the second thin film transistor TFT2 can maintain the data signal voltage, so that the second thin film transistor TFT2 is in a conducting state, and the driving current drives the organic light-emitting diode LED to emit light through the second thin film transistor TFT2.

In the above example, the first thin film transistor TFT1 is the switching thin film transistor 20 described in the previous embodiment, the second thin film transistor TFT2 is the driving thin film transistor 30 described in the foregoing embodiments. For the specific structures of the switching thin film transistor 20 and the driving thin film transistor 30, reference can be made to the descriptions in the foregoing embodiments, and details are not described herein.

A display device and a manufacturing method of the display device provided by the embodiments of the present application have been introduced in detail above. The principles and implementations of the present application are described herein with specific examples, and the descriptions of the embodiments are only used to help understand the methods and core ideas of the present application. Meanwhile, for those skilled in the art, according to the idea of the present application, there will be changes in the specific embodiments and the scope of application. In conclusion, the content of the present specification should not be construed as a limitation on this application.

What is claimed is:

1. A display device, comprising:
a substrate;
a switching thin film transistor disposed on a side of the substrate and comprising a first gate, a first active layer, a first source, and a first drain, wherein the first gate is disposed on the substrate, the first active layer is positioned on a side of the first gate away from the substrate, and the first source and the first drain are disposed in a same layer on a side of the first active layer away from the substrate;
a driving thin film transistor disposed on a side of the substrate and connected to the switching thin film transistor, wherein the driving thin film transistor comprises a second source, a second drain, a second active layer, and a second gate, and wherein the second source and the second drain are disposed in a same layer of the substrate, the second active layer is positioned on a side of the second source and the second drain away from the substrate, and the second gate is positioned on a side of the second active layer away from the substrate; and a connecting electrode positioned on a side of the second gate away from the substrate, wherein the second gate is connected to the first drain through the connecting electrode.

2. The display device of claim 1, wherein the first source, the first drain, and the second gate are positioned in a same metal layer.

3. The display device of claim 1, wherein the first active layer and the second active layer are disposed in a same layer, and material of the first active layer and material of the second active layer both comprise a metal oxide semiconductor.

4. The display device of claim 1, wherein the first gate, the second source, and the second drain are disposed in a same layer.

5. The display device of claim 4, wherein the second active layer comprises a channel, and wherein an orthographic projection of the second source or an orthographic projection of the second drain on a plane where the channel is located at least partially covers the channel.

6. The display device of claim 5, wherein an orthographic projection of the second source on a plane where the substrate is located is positioned outside an orthographic projection of the channel on the plane where the substrate is located, and wherein the display device further comprises a light shielding layer disposed on a side of the substrate close to the second active layer, and an orthographic projection of the light shielding layer on the plane where the substrate is located covers the channel.

7. The display device of claim 5, wherein the second active layer further comprises a source contact part and a drain contact part positioned at opposite sides of the channel, wherein the second source is connected to the source contact part and extends from the source contact part toward the drain contact part, and wherein an orthographic projection of the channel on a plane where the substrate is located is positioned within an orthographic projection of the second source on the plane where the substrate is located, and the second drain is connected to the drain contact part.

8. The display device of claim 7, further comprising a gate insulating layer disposed between the channel and the second gate, wherein in a direction of the second source toward the second drain, a width of the second gate is less than a width of the gate insulating layer.

9. A display device, comprising:
a substrate;
a switching thin film transistor disposed on a side of the substrate and comprising a first gate, a first active layer, a first source, and a first drain, wherein the first gate is disposed on the substrate, the first active layer is positioned on a side of the first gate away from the substrate, the first source and the first drain are disposed in a same layer on a side of the first active layer away from the substrate, and the first source and the first drain cover portions of the first active layer, respectively; and
a driving thin film transistor disposed on a side of the substrate and connected to the switching thin film transistor, wherein the driving thin film transistor comprises a second source, a second drain, a second active layer, and a second gate, and wherein the second source and the second drain are disposed in a same layer of the substrate, the second active layer as a whole is positioned on a side of the second source and the second drain away from the substrate along a direction perpendicular to the substrate, and the second gate is positioned on a side of the second active layer away from the substrate; and
wherein the first source, the first drain, and the second gate are positioned in a same metal layer, and the first gate, the second source, and the second drain are disposed in a same layer.

10. The display device of claim 9, further comprising a connecting electrode positioned on a side of the second gate away from the substrate, wherein the second gate is connected to the first drain through the connecting electrode.

11. The display device of claim 9, wherein the first active layer and the second active layer are disposed in a same layer, and material of the first active layer and material of the second active layer both comprise a metal oxide semiconductor.

12. The display device of claim 9, wherein the second active layer comprises a channel, and wherein an orthographic projection of the second source or an orthographic projection of the second drain on a plane where the channel is located at least partially covers the channel.

13. The display device of claim 12, wherein the second active layer further comprises a source contact part and a drain contact part positioned at opposite sides of the channel, wherein the second source is connected to the source contact part and extends from the source contact part toward the drain contact part, and wherein an orthographic projection of the channel on a plane where the substrate is located is positioned within an orthographic projection of the second source on the plane where the substrate is located, and the second drain is connected to the drain contact part.

14. The display device of claim 12, further comprising a gate insulating layer disposed between the channel and the second gate, wherein in a direction of the second source toward the second drain, a width of the second gate is less than a width of the gate insulating layer.

15. The display device of claim 12, wherein an orthographic projection of the second source on a plane where the substrate is located is positioned outside an orthographic projection of the channel on the plane where the substrate is located, and wherein the display device further comprises a light shielding layer disposed on a side of the substrate close to the second active layer, and an orthographic projection of the light shielding layer on the plane where the substrate is located covers the channel.

16. A manufacturing method of the display device of claim 1, comprising following steps:
providing the substrate;
forming a first metal layer on the substrate;
patterning the first metal layer to form the first gate, the second source, and the second drain;
forming the first active layer on the first gate, and forming the second active layer on the second source and the second drain;
forming the first source and the first drain on the first active layer, and forming the second gate on the second active layer;
wherein after forming the first source and the first drain on the first active layer and forming the second gate on the second active layer, the method further comprises:
forming a passivation layer on the first source, the first drain, and the second gate;
patterning the passivation layer to form a first connecting hole exposing the first drain and a second connecting hole exposing the second gate; and forming a connecting electrode on the passivation layer such that the second gate is connected to the first drain through the connecting electrode.

17. The manufacturing method of the display device of claim 16, wherein after the step of forming the second active layer on the second source and the second drain further comprises:

forming a gate insulating layer on the second active layer, wherein an orthographic projection of the gate insulating layer on a plane where the substrate is located at least partially overlaps with an orthographic projection of the second source on the plane where the substrate is located.

18. The manufacturing method of the display device of claim 17, wherein the step of forming the first source and the first drain on the first active layer, and forming the second gate on the second active layer further comprises:

forming a second metal layer on the gate insulating layer, wherein the second metal layer covers the first active layer and part of the second active layer not covered by the gate insulating layer; and patterning the second metal layer to form the first source, the first drain, and the second gate.

19. The manufacturing method of the display device of claim 18, wherein in the step of forming the second metal layer on the gate insulating layer, a region of the second active layer covered by the gate insulating layer is formed into a channel, a source contact part and a drain contact part is formed at a portion of the second active layer not covered by the gate insulating layer, the source contact part contacts with the second source, and the drain contact part contacts with the second drain.

* * * * *